United States Patent
Choi (10) Patent No.: US 8,829,341 B2
(45) Date of Patent: Sep. 9, 2014

(54) SOLAR CELL AND METHOD FOR MANUFACTURING SAME

(75) Inventor: Chul Hwan Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/639,274

(22) PCT Filed: Apr. 27, 2011

(86) PCT No.: PCT/KR2011/003125
§ 371 (c)(1),
(2), (4) Date: Oct. 4, 2012

(87) PCT Pub. No.: WO2012/015151
PCT Pub. Date: Feb. 2, 2012

(65) Prior Publication Data
US 2013/0112269 A1    May 9, 2013

(30) Foreign Application Priority Data
Jul. 30, 2010   (KR) .................... 10-2010-0074414

(51) Int. Cl.
| | | |
|---|---|---|
| *H01L 31/00* | (2006.01) | |
| *H01L 31/0216* | (2014.01) | |
| *H01L 31/0749* | (2012.01) | |
| *H01L 31/0224* | (2006.01) | |
| *B82Y 99/00* | (2011.01) | |

(52) U.S. Cl.
CPC ......... *H01L 31/02168* (2013.01); *Y02E 10/541* (2013.01); *H01L 31/0749* (2013.01); *H01L 31/022483* (2013.01); *B82Y 99/00* (2013.01)
USPC ....................................... 136/259

(58) Field of Classification Search
CPC ............. H01L 31/022475; H01L 31/022483; H01L 31/0749
USPC .............................. 136/259; 438/69
See application file for complete search history.

(56) References Cited

U.S. PATENT DOCUMENTS

| | | | | |
|---|---|---|---|---|
| 4,342,879 | A | * | 8/1982 | Catalano et al. ............... 136/265 |
| 4,614,835 | A | * | 9/1986 | Carson et al. .................. 136/250 |
| 5,421,909 | A | * | 6/1995 | Ishikawa et al. ............... 136/256 |
| 2001/0017153 | A1 | * | 8/2001 | Kubota et al. .................. 136/256 |
| 2005/0253142 | A1 | * | 11/2005 | Negami et al. ................... 257/65 |

(Continued)

FOREIGN PATENT DOCUMENTS

| | | |
|---|---|---|
| KR | 10-2009-0029495 A | 3/2009 |
| KR | 10-2009-0039302 A | 4/2009 |
| KR | 10-2011-0036220 A | 4/2011 |
| WO | WO-2009/085224 A2 | 7/2009 |

OTHER PUBLICATIONS

Notice of Allowance dated Apr. 26, 2012 in Korean Application No. 10-2010-0074414, filed Jul. 30, 2010.

(Continued)

*Primary Examiner* — Eli Mekhlin
(74) *Attorney, Agent, or Firm* — Saliwanchik, Lloyd & Eisenschenk (57) ABSTRACT

There is provided a solar cell comprising: a substrate; a rear electrode layer disposed on the substrate; a light absorption layer disposed on the rear electrode layer; and a window layer disposed on the light absorption layer, wherein the window layer includes a plurality of conductive particles. The conductive particles improve the optical and electrical properties of the window layer.

6 Claims, 9 Drawing Sheets

(56) References Cited

U.S. PATENT DOCUMENTS

| | | | |
|---|---|---|---|
| 2006/0180200 A1* | 8/2006 | Platzer Bjorkman et al. | 136/265 |
| 2009/0165845 A1* | 7/2009 | Tsao et al. | 136/256 |
| 2010/0096002 A1* | 4/2010 | Hayashi et al. | 136/252 |
| 2012/0031486 A1* | 2/2012 | Parce et al. | 136/256 |
| 2012/0100661 A1 | 4/2012 | Choe et al. | |

OTHER PUBLICATIONS

International Search Report in International Application No. PCT/KR2011/003125, filed Apr. 27, 2011.

* cited by examiner

Figure 19

SOLAR CELL AND METHOD FOR MANUFACTURING SAME

CROSS-REFERENCE TO RELATED APPLICATIONS

This application is the U.S. national stage application of International Patent Application No. PCT/KR 2011/003125, filed Apr. 27, 2011, which claims priority to Korean Application No. 10-2010-0074414, filed Jul. 30, 2010, the disclosures of each of which are incorporated herein by reference in their entirety.

TECHNICAL FIELD

The present invention relates to a solar cell and a method for manufacturing the same.

BACKGROUND ART

Recently, with the increase of energy consumption, development of solar cells converting solar energy into electric energy is in progress.

Particularly, a CIGS-based solar cell, which is a pn hetero junction device having a substrate structure including a glass substrate, a metal rear electrode layer, a p-type CIGS-based light absorbing layer, a high-resistance buffer layer, and an n-type window layer has been widely used.

In this solar cell, studies to improve the electrical and optical properties of the solar cell such as low resistance, high transmittance and the like are proceeding.

DISCLOSURE

Technical Problem

An aspect of the present invention provides a solar cell with improved electrical and optical properties, and a method for manufacturing the same.

Technical Solution

According to an aspect of the present invention, there is provided a solar cell including: a substrate; a rear electrode layer disposed on the substrate; a light absorption layer disposed on the rear electrode layer; and a window layer disposed on the light absorption layer, wherein the window layer includes a plurality of conductive particles.

According to another aspect of the present invention, there is provided a solar cell including: a substrate; a rear electrode layer disposed on the substrate; a light absorption layer disposed on the rear electrode layer; and a window layer disposed on the light absorption layer, wherein the window layer includes a plurality of the first conductive particles disposed on a first plane.

According to another aspect of the present invention, there is provided a method for manufacturing the solar cell according to one embodiment including forming a rear electrode layer on a substrate; forming a light absorption layer on the rear electrode layer; and forming a window layer including a plurality of conductive particles on the light absorption layer.

Advantageous Effects

The solar cell according to the embodiments includes a window layer including a plurality of conductive particles. Particularly, the conductive particles can be included in the window layer by forming a nano-particle layer.

Therefore, resistance of the window layer is reduced by the nano-particle layer. Further, transmittance of the window layer can be improved by plasmon phenomenon caused by the conductive particles.

Particularly, because resistance of the window layer is reduced by the nano-particle layer, the thinner window layer can be formed. Namely, though it is formed thin, it can have enough conductivity because the window layer includes the conductive particles.

Accordingly, the window layer can be formed thinner, and as thickness becomes thinner, the amount of the required material and the process time can be reduced, and improved transmittance can be secured.

Thus, the solar cell according to the embodiments includes the window layer with improved electrical and optical properties, and has enhanced performance.

DESCRIPTION OF DRAWINGS

The above and other objects, features and other advantages of the present invention will be more clearly understood from the following detailed description taken in conjunction with the accompanying drawings, in which.

BEST MODE

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals in the drawings denote like elements, and thus their description will be omitted.

In the description of the embodiment, when each substrate, layer, film or electrode and the like is described to be formed "on" or "under" thereof, "on" or "under" also means one to be formed "directly" or "indirectly (through other component)". Also, the criteria regarding "on" or "under" of each component will be described based on the drawings. In the drawing, the size of each component may be exaggerated to describe, and does not mean the size that is in fact applied.

Figure 1:
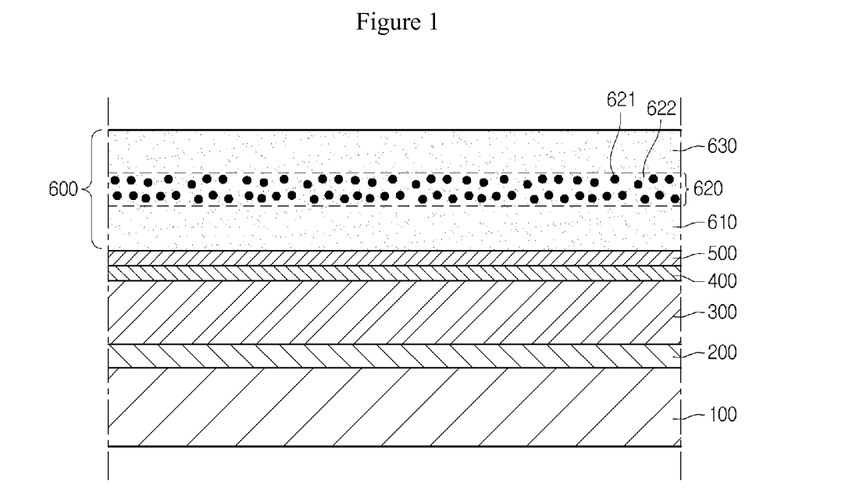
FIG. 1 is a cross sectional view showing a solar cell according to one embodiment.

FIG. 1 is a cross sectional view showing a solar cell according to one embodiment.

Referring to FIG. 1, the solar cell according to one embodiment includes a supporting substrate 100, a rear electrode layer 200, a light absorption layer 300, a buffer layer 400, a high-resistance buffer layer 500 and a window layer 600.

The supporting substrate 100 has plate shape, and supports the rear electrode layer 200, the light absorption layer 300, the buffer layer 400, the high-resistance buffer layer 500 and the window layer 600.

The supporting substrate 100 may be an insulator. The supporting substrate 100 may be a glass substrate, a plastic substrate or a metal substrate. More specifically, the supporting substrate 100 may be a soda lime glass substrate. The supporting substrate 100 may be transparent. The supporting substrate 100 may be rigid or flexible.

The rear electrode layer 200 is disposed on the supporting substrate 100. The rear electrode layer 200 is a conductive layer. A metal such as molybdenum (Mo) can be used for the rear electrode layer 200.

Further, the rear electrode layer 200 may include two or more layers. In the case, each layer can be formed with the same or different metal with other layer.

The light absorption layer 300 is disposed on the rear electrode layer 200. The light absorption layer 300 includes a I-III-VI-based compound. For example, the light absorption layer 300 may have copper-indium-gallium-selenide-based ($Cu(In,Ga)Se_2$; CIGS-based) crystal structure, copper-indium-selenide-based or copper-gallium-selenide-based crystal structure.

Energy band gap of the light absorption layer 300 may be about 1 eV to 1.8 eV.

The buffer layer 400 is disposed on the light absorption layer 300. The buffer layer 400 is directly contacted to the light absorption layer 300. The buffer layer 400 includes cadmium sulfide. Energy band gap of the buffer layer may be about 1.9 eV to 2.3 eV.

The high-resistance buffer layer 500 is disposed on the buffer layer 400. The high-resistance buffer layer 500 includes zinc oxide (i-ZnO), which is not doped with impurities. Energy band gap of the high-resistance buffer layer 500 may be about 3.1 eV to 3.3 eV.

The window layer 600 is disposed on the light absorption layer 300. More specifically, the window layer 600 is disposed on the high-resistance buffer layer 500. The window layer 600 is a conductive layer. The window layer 600 includes a first transparent conductive layer 610, a nano-particle layer 620 and a second transparent conductive layer 630.

The first transparent conductive layer 610 is disposed on the high-resistance buffer layer 500. The first transparent conductive layer 610 is transparent. A material such as Al-doped ZnO (AZO), indium zinc oxide (IZO) or indium tin oxide (ITO) can be used for the first transparent conductive layer 610. Further, thickness of the first transparent conductive layer 610 may be about 20% to 80% of the thickness of the window layer 600.

The nano-particle layer 620 is disposed on the first transparent conductive layer 610. The nano-particle layer 620 includes a plurality of conductive particles 621. For example, the conductive particles 621 are metal nano-particles.

Diameters of the conductive particles 621 may be about 5 nm to 20 nm, and a material such as gold (Au) or silver (Ag) can be used for the conductive particles 621. The conductive particles 621 may have spherical shape but not limited thereto. Namely, it may have various shapes such as polyhedral shape.

Further, the nano-particle layer 620 includes a host 622 surrounding the conductive particles 621. The host 622 is transparent and conductive. The host 622 may be formed with the same material as the first transparent conductive layer 610. More specifically, the host 622 and the first transparent conductive layer 610 can be formed integrally. Further, the host 622 and the second transparent conductive layer 630 also can be formed in one.

The nano-particle layer 620 may have a structure wherein the conductive particles 621 are uniformly distributed on the host 622. Thickness of the nano-particle layer 620 may be about 25 nm to 70 nm. Further, if density of the conductive particles 621 is too high, transmittance of the window layer 600 may decrease. Further, if density of the conductive particles 621 is too low, electrical and optical properties of the nano-particle layer 620 may decrease.

The second transparent conductive layer 630 is disposed on the nano-particle layer 620. The second transparent conductive layer 630 is transparent. A material such as AZO, IZO or ITO can be used for the second transparent conductive layer 630. Further, thickness of the second transparent conductive layer 630 may be about 20% to 80% of the thickness of the window layer 600.

The first transparent conductive layer 610, the nano-particle layer 620 and the second transparent conductive layer 630 may be formed integrally. Namely, the window layer 600 has a structure wherein the conductive particles 621 are inserted in the middle of the AZO layer to the designated height.

Because the nano-particle layer 620 includes the conductive particles 621, it has low resistance. Namely, the nano-particle layer 620 reduces resistance to the horizontal direction of the window layer 600. Therefore, resistance of the window layer 600 is entirely reduced, and the solar cell according to the embodiment has improved performance.

Further, because the conductive particles 621 are nano-sized, surface plasmon phenomenon may occur between the host 622 and the conductive particles 621. Namely, light incidence may be induced along the interfaces of the conductive particles 621 and the host 622. Accordingly, reflectance is reduced and incidence rate is improved. Namely, entire transmittance of the window layer 600 can be improved by the nano-particle layer 620.

Particularly, because resistance of the window layer 600 is reduced by the nano-particle layer 620, the thinner window layer 600 can be formed. Namely, though it is formed thin, it can have enough conductivity because the window layer 600 includes the conductive particles 621.

Therefore, the window layer 600 can be formed thin, and as it becomes thinner, the amount of the required material and process time can be reduced and the enhanced transmittance can be secured.

Therefore, the solar cell according to the embodiment includes the window layer 600 with improved electrical and optical properties, and has enhanced performance.

FIGS. 2 to 7 are views showing a process for manufacturing the solar cell according to another embodiment. This method will be described with reference to the solar cell previously described. The previous description about the solar cell can be essentially combined to the description for this manufacturing method.

Figure 2:
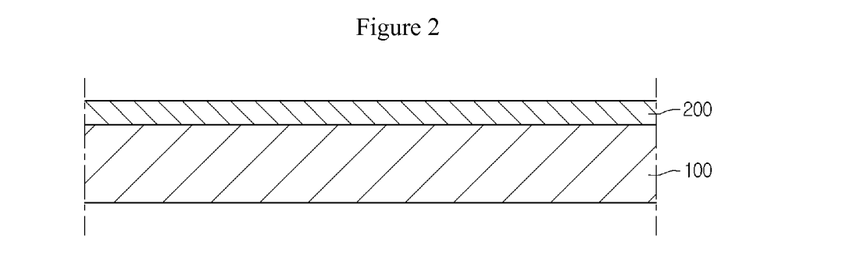
FIGS. 2 to 7 are cross sectional views showing a method for manufacturing the solar cell according to one embodiment.

Referring to FIG. 2, metal such as Mo is deposited on the supporting substrate 100 by sputtering process, and the rear electrode layer 200 is formed. The rear electrode layer 200 can be formed through two processes having different process conditions each other.

Additional layers such as diffusion barrier can be interposed between the supporting substrate 100 and the rear electrode layer 200.

Figure 3:
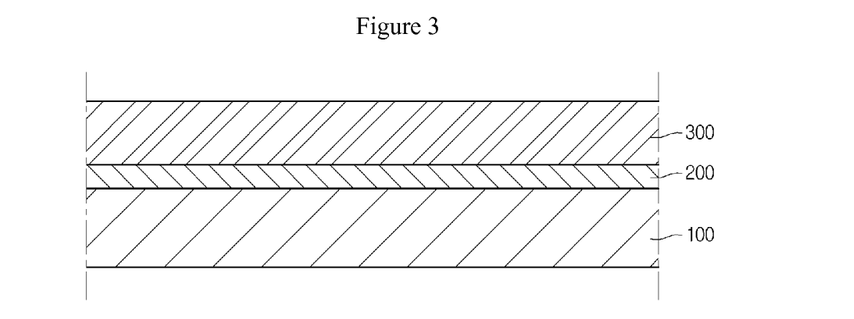

Referring to FIG. 3, the light absorption layer 300 is disposed on the rear electrode layer 200.

The light absorption layer 300 can be formed by sputtering process or evaporation method.

For example, in order to form the light absorption layer 300, a method forming a Cu—In—Ga—Se-based (Cu(In,Ga)Se$_2$; CIGS-based) light absorption layer 300 by evaporating Cu, In, Ga and Se simultaneously or separately and a method forming the layer by forming a metal precursor layer followed by processing selenization are being broadly used.

Selenization after forming the metal precursor layer is specified: the metal precursor layer is formed on the rear electrode 200 by sputtering process using Cu target, In target and Ga target. Then, the Cu—In—Ga—Se-based (Cu(In,Ga)Se$_2$; CIGS-based) light absorption layer 300 is formed from the metal precursor layer by selenization process.

Unlike this, both sputtering process and selenization process using Cu target, In target and Ga target may be conducted at the same time.

Unlike this, CIS-based or CIG-based light absorption layer 300 can be formed by sputtering process and selenization process using only Cu target and In target, or Cu target and Ga target.

Figure 4:
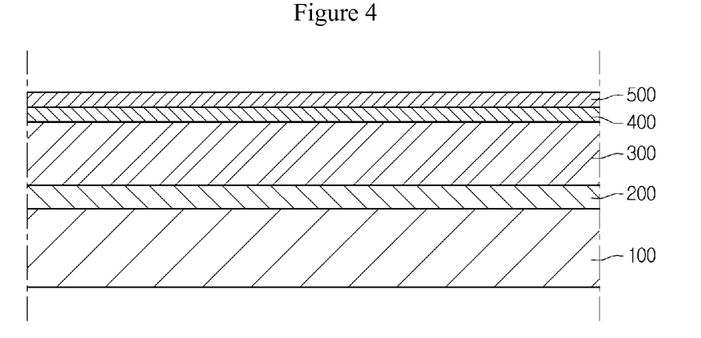

Referring to FIG. 4, the buffer layer 400 and the high-resistance buffer layer 500 are formed on the light absorption layer 300.

The buffer layer 400 can be formed by chemical bath deposition (CBD) process. For example, after the light absorption layer 300 is formed, the light absorption layer 300 is immersed in a solution comprising materials for forming cadmium sulfide, and then the buffer layer 400 including the cadmium sulfide is formed on the light absorption layer 300.

Then, ZnO is deposited on the buffer layer 400 by sputtering process and the like, and the high-resistance buffer layer 500 is formed.

Figure 5:
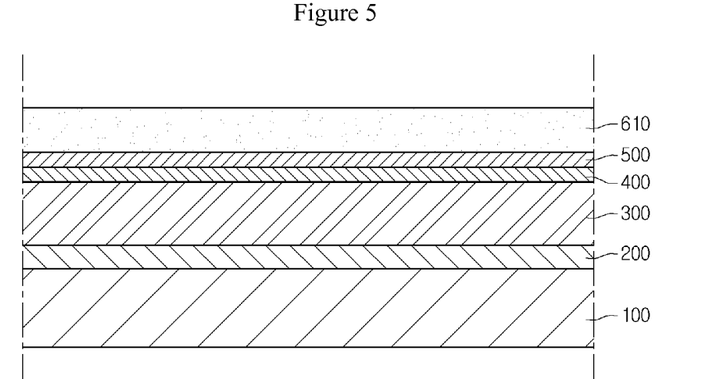
Figure 6:
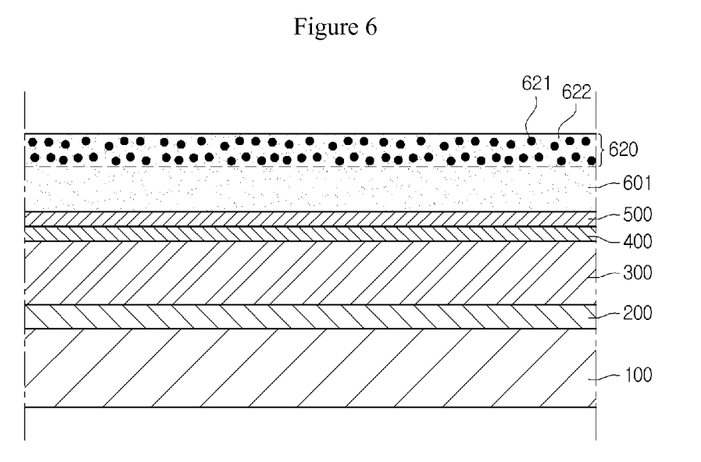
Figure 7:
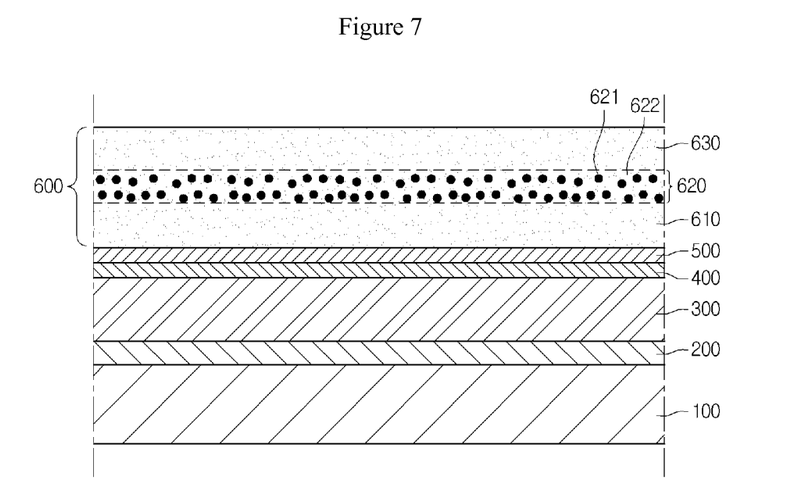

Referring to FIGS. 5 to 7, the window layer 600 is formed on the high-resistance buffer layer 500.

As shown in FIG. 5, in order to form the window layer 600, a transparent conductive material is laminated on the high-resistance buffer layer 500 so as to form the first transparent conductive layer 610. AZO, IZO or ITO and the like can be used as the transparent conductive material.

As shown in FIG. 6, after the first transparent conductive layer 610 is formed to the designated height, a plurality of the conductive particles 621 is deposited on the first transparent conductive layer 610. Depositing the conductive particles 621 on the first transparent conductive layer 610 and depositing the transparent conductive material may be conducted at the same time.

At this time, in order to deposit the conductive particles 621, RF of about 50 V to 100 V DC power can be applied to the sputtering target including Ag or Au. Through this RF sputtering process, metal nano-particles having diameters of about 5 nm to 20 nm are deposited together with the transparent conductive material. Accordingly, the nano-particle layer 620 is formed on the first transparent conductive layer 610.

Unlike this, after the first transparent conductive layer 610 is formed, the deposition of the transparent conductive material is stopped. Then, the metal layer including Ag or Au is formed on the first transparent conductive layer 610. Then, the metal layer is agglomerated to a plurality of metal nano-particles by rapid thermal process. Then, the transparent conductive material is deposited again so as to form the nano-particle layer 620.

Unlike this, after the first transparent conductive layer 610 is formed, a solution including a plurality of the conductive particles 621 is coated on the first transparent conductive layer 610. Then, the solvent included in the solution is removed by evaporation and the like, and the conductive particles 621 can be deposited on the first transparent conductive layer 610. Then, the transparent material is deposited again so as to form the nano-particle layer 620.

Referring to FIG. 7, the second transparent conductive layer 630 is formed on the nano-particle layer 620. The second transparent conductive layer 630 can be formed by the same method as the method for forming the first transparent conductive layer 610.

Thus, the solar cell which includes the window layer 600 with improved electrical and optical properties and has improved performance can be provided.

Figure 8:
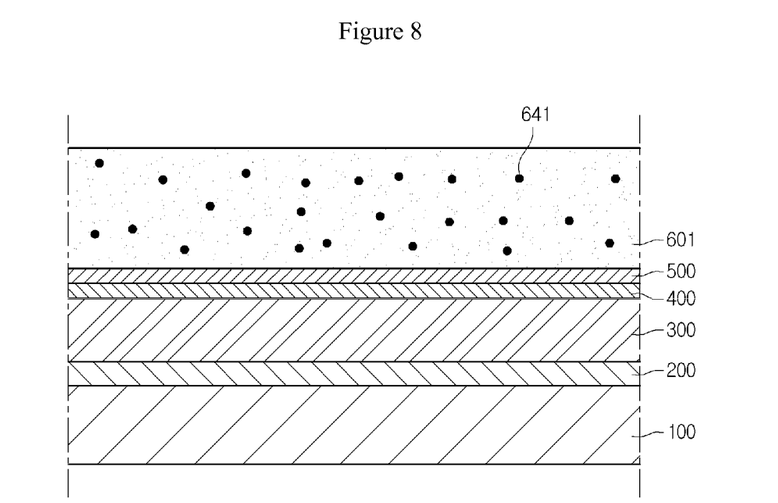
FIG. 8 is a cross sectional view showing a solar cell according to another embodiment.

FIG. 8 is a cross sectional view showing a solar cell according to another embodiment. This embodiment will be described while referring to the previous description about the solar cell and the method for fabrication the same, and the window layer will be further described. The previously described embodiments can be essentially combined to the description about this embodiment except for the modified parts.

Referring to FIG. 8, a plurality of the conductive particles 641 is uniformly distributed to the entire window layer 601. Namely, the conductive particles 641 form a layer on the window layer 601 by being entirely distributed instead of being included therein.

At this time, thickness of the window layer 601 may be about 500 nm to 1 μm.

Because the conductive particles 641 are entirely distributed on the window layer 601, surface Plasmon phenomenon can be occurred through the entire window layer 601. Therefore, the window layer 601 has improved transmittance, and the solar cell according to the embodiment has improved optical performance.

Figure 9:
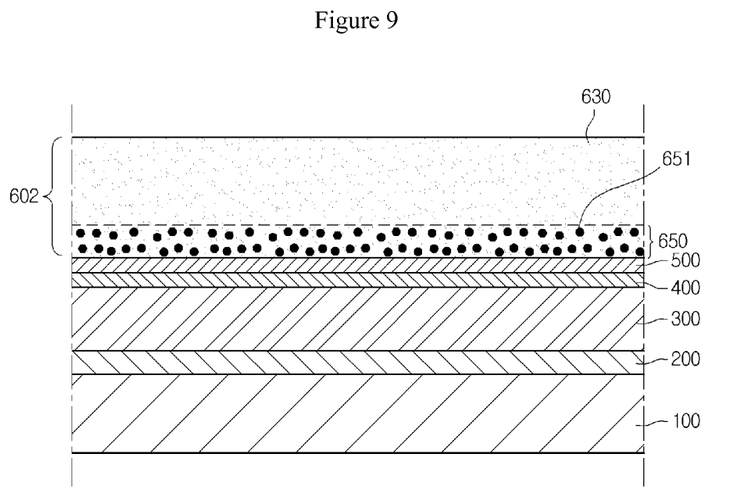
FIG. 9 is a cross sectional view showing a solar cell according to another embodiment.

FIG. 9 is a cross sectional view showing a solar cell according to another embodiment. This embodiment will be described while referring to the previous description about solar cell and the method for fabrication the same, and the window layer will be further described. The previously described embodiments can be essentially combined to the description about this embodiment except for the modified parts.

Referring to FIG. 9, the nano-particle layer 650 is adjacent to the light absorption layer 300. More specifically, the nano-particle layer 650 is adjacent to the buffer layer. More specifically, the nano-particle layer 650 is adjacent to the high-resistance buffer layer 500.

Namely, the nano-particle layer 650 is disposed on the lowest level of the window layer 602. At this time, the window layer 602 does not include the first transparent conductive layer, or includes the very thin first transparent conductive layer.

Namely, the window layer 602 may include the nano-particle layer 650 and the second transparent conductive layer 630. The nano-particle layer 650 can be directly contacted to the high-resistance buffer layer 500.

Because the nano-particle layer 650 is adjacent to the high-resistance buffer layer 500, electrical property of the window layer 602 is improved. Namely, electrons formed by the light absorbed to the light absorption layer 300 are transferred through a region where the window layer 602 and the high-resistance buffer layer 500 are adjacent. At this time, the nano-particle layer 650 includes the conductive particles 651, and effectively helps electron movement.

Accordingly, the solar cell according to the embodiment has improved electrical property. Namely, the solar cell according to the embodiment further strengthens electrical property by the nano-particle layer 650 than optical property.

Figure 10:
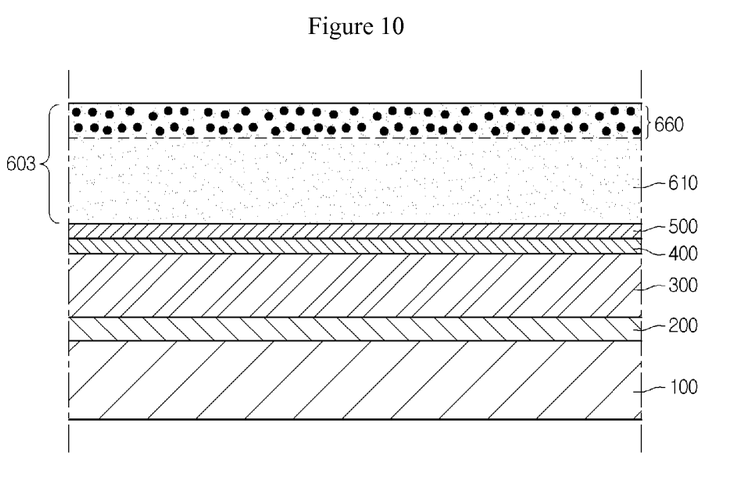
FIG. 10 is a cross sectional view showing a solar cell according to another embodiment.

FIG. 10 is a cross sectional view showing a solar cell according to another embodiment. This embodiment will be described while referring to the previous description about solar cell and the method for fabrication the same, and the window layer will be further described. The previously described embodiments can be essentially combined to the description about this embodiment except for the modified parts.

Referring to FIG. 10, the nano-particle layer 660 is adjacent to the upper face. More specifically, the nano-particle layer 660 is disposed on the highest level of the window layer 603. At this time, the window layer 603 does not include the second transparent conductive layer or includes the very thin second transparent conductive layer.

Namely, the window layer 603 may include the first transparent conductive layer 610 and the nano-particle layer 660. The nano-particle layer 660 can be directly exposed on the upper face of the window layer 603.

Because the nano-particle layer 660 is adjacent to the upper face, optical property of the window layer 603 is improved. Namely, the reflected light can be effectively reduced because of the direct incidence of light to the nano-particle layer 660. Further, the nano-particle layer 660 can improve transmittance of the window layer 603 as a whole.

Accordingly, the solar cell according to the embodiment has improved optical property. Namely, the solar cell according to the embodiment further strengthens optical property by the nano-particle layer 660 than electrical property.

Figure 11:
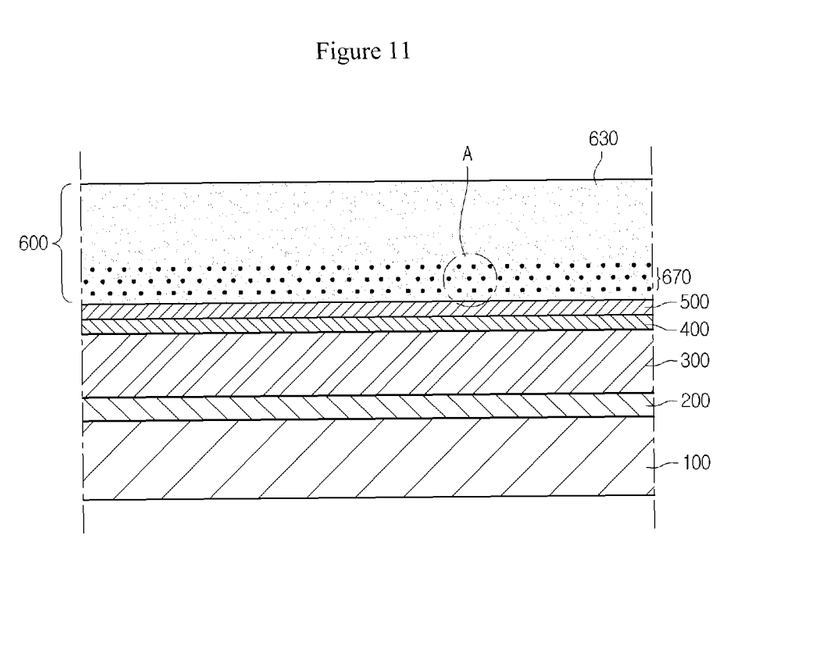
FIG. 11 is a cross sectional view showing a solar cell according to another embodiment.
Figure 12:
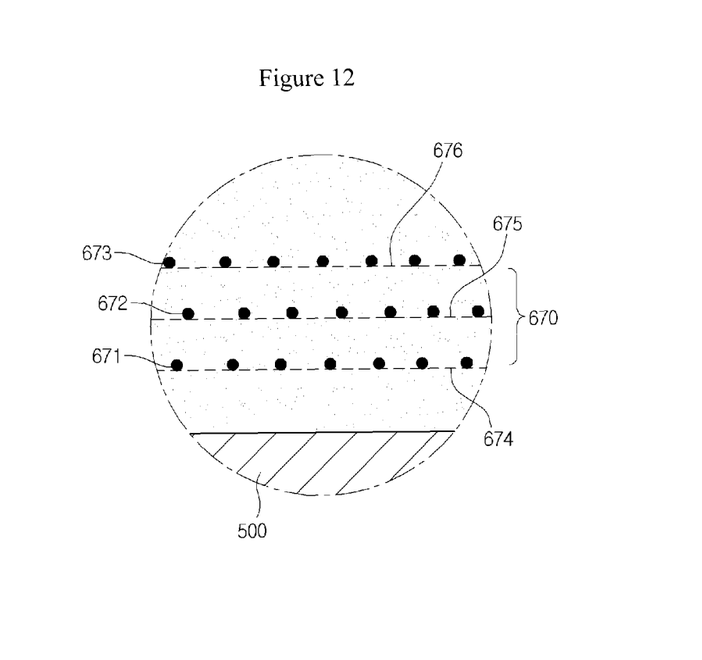
FIG. 12 is a cross sectional view enlarging the A section in FIG. 11.

FIG. 11 is a cross sectional view showing a solar cell according to another embodiment. FIG. 12 is a cross sectional view enlarging the A section in FIG. 11. This embodiment will be described while referring to the previous description about solar cell and the method for fabrication the same, and the window layer will be further described. The previously described embodiments can be essentially combined to the description about this embodiment except for the modified parts.

Referring to FIGS. 11 and 12, the window layer 600 includes the nano-particle layer 670 provided with the first conductive particles 671, the second conductive particles 672 and the third conductive particles 673.

The first conductive particles 671 are disposed in the nano-particle layer 670 not randomly but regularly. More specifically, the first conductive particles 671 are disposed on the same plane. More specifically, the first conductive particles 671 are disposed on an imaginary first plane 674.

The second conductive particles 672 are disposed on the first conductive particles 671. Likewise, the second conductive particles 672 are regularly disposed in the nano-particle layer 670. More specifically, the second conductive particles 672 are disposed on the same plane. More specifically, the second conductive particles 672 are disposed on an imaginary second plane 675.

The third conductive particles 673 are disposed on the second conductive particles 672. Likewise, the third conductive particles 673 are regularly disposed in the nano-particle layer 670. More specifically, the third conductive particles 673 are disposed on the same plane. More specifically, the third conductive particles 673 are disposed on an imaginary third plane 676.

Diameters of the first conductive particles, the second conductive particles 672 and the third conductive particles 673 may be about 2 nm to 20 nm. Further, distance between the first plane 674 and a second plane 675 may be about 20 nm to 60 nm. Further, distance between the second plane 675 and the third plane 676 may be about 20 nm to 60 nm.

Further, distance between the first conductive particles 671 may be about 5 nm to 50 nm. Distance between the second conductive particles 672 may be about 5 nm to 50 nm. Distance between the third conductive particles 673 may be about 5 nm to 50 nm.

The first conductive particles 671, the second conductive particles 672 and the third conductive particles 673 are regularly disposed. Accordingly, in the solar cell according to this embodiment, the first conductive particles 671, the second conductive particles 672 and the third conductive particles 673 can be disposed easily to the desired location.

Therefore, in the solar cell according to this embodiment, the first conductive particles 671, the second conductive particles 672 and the third conductive particles 673 can be controlled easily to have improved light to electric energy conversion efficiency.

FIGS. 13 to 19 are cross sectional view showing a method for manufacturing the solar cell according to another embodiment. This embodiment will be described while referring to the previous description about solar cell and the method for fabrication the same. The previously described embodiments can be essentially combined to the description about this embodiment except for the modified parts.

Figure 13:
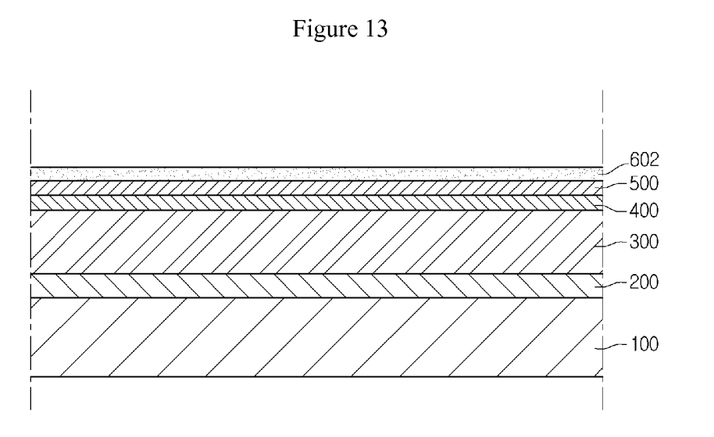
FIGS. 13 to 19 are cross sectional view showing a method for manufacturing the solar cell according to another embodiment.

Referring to FIG. 13, the rear electrode layer 200, the light absorption layer 300, the buffer layer 400 and the high-resistance buffer layer 500 are formed on the supporting substrate 100 in order. Then, a transparent conductive material is deposited on the high-resistance buffer layer 500, and the first transparent conductive layer 602 is formed. Thickness of the first transparent conductive layer 602 may be about 20% to 80% of the thickness of the entire window layer 600.

Figure 14:
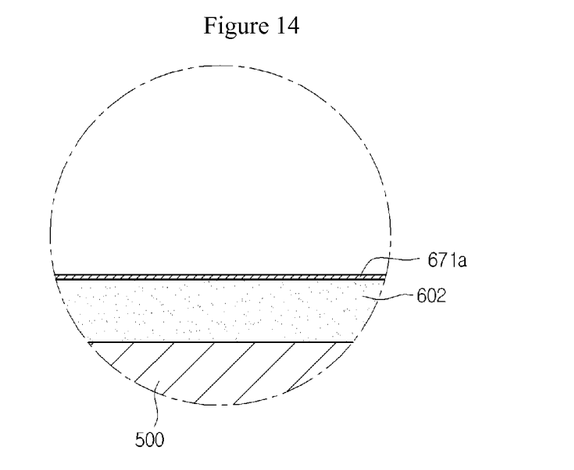

Referring to FIG. 14, a first metal layer 671a is formed on the first transparent conductive layer 602. Au or Ag and the like can be used as the first metal layer 671a. Thickness of the first metal layer 671a may be about 1 nm to 10 nm. The first metal layer 671a can be formed by sputtering process.

Figure 15:
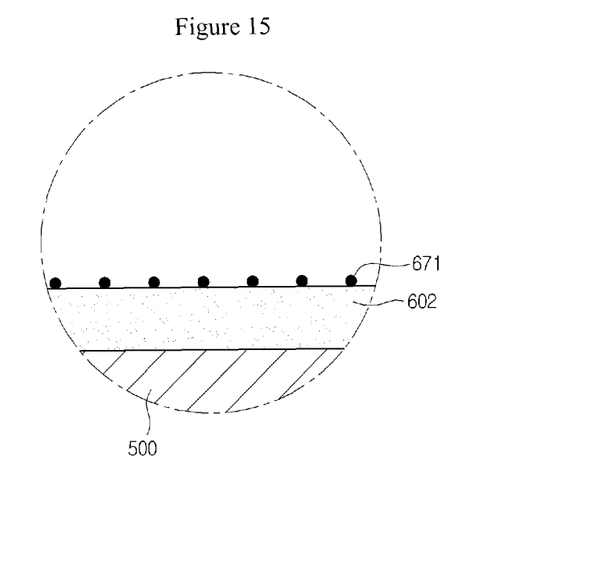

Referring to FIG. 15, the first metal layer 671a is heat-treated, and the metals included in the first metal layer 671a are agglomerated one another. Accordingly, the first conductive particles 671 are formed on the first transparent conductive layer 602. The first metal layer 671a can be heat-treated at about 300° C. to 700° C. for about 10 sec to 5 min.

Figure 16:
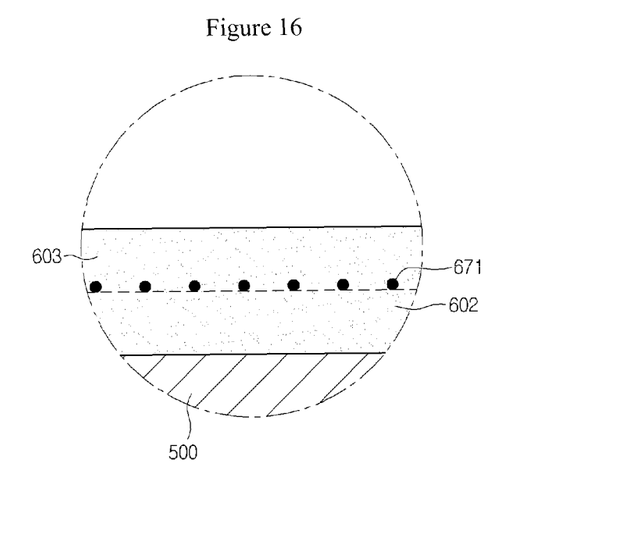

Referring to FIG. 16, the second transparent conductive layer 603 is formed on the first transparent conductive layer 602 to cover the first conductive particles 671. Thickness of the second transparent conductive layer 603 may be about 20 nm to 60 nm.

Figure 17:
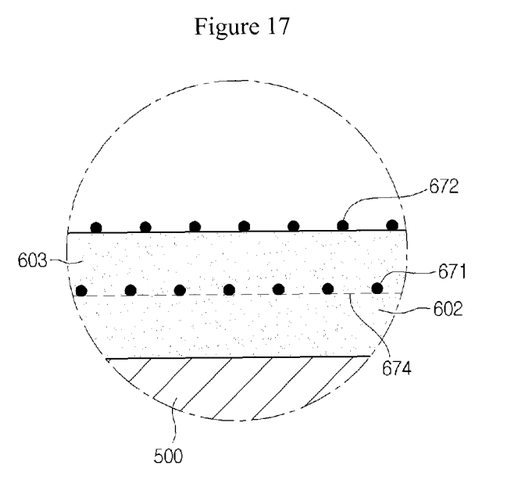

Referring to FIG. 17, the second conductive particles 672 are formed on the second transparent conductive layer 603 in the same way as the first conductive particles 671. Namely, after a second metal layer is formed on the second transparent conductive layer 603, the second conductive particles 672 can be formed by heat-treating the second metal layer.

Figure 18:
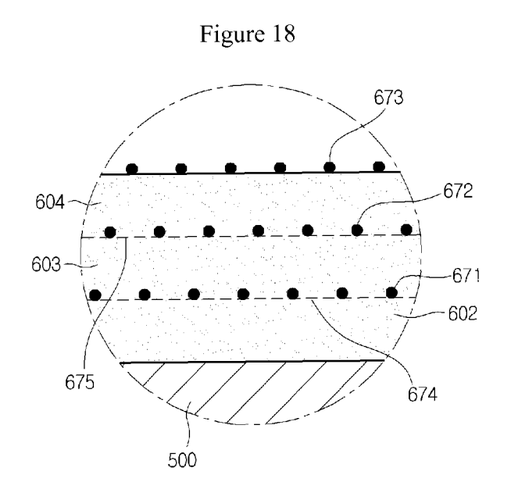

Referring to FIG. 18, a third transparent conductive layer 604 is formed on the second transparent conductive layer 603 to cover the second conductive particles 672. Thickness of the third transparent conductive layer 604 may be about 20 nm to 60 nm.

Then, the third conductive particles 673 are formed on the third transparent conductive layer 604 in the same way as the first conductive particles 671. Namely, after a third metal layer is formed on the third transparent conductive layer 604, the third conductive particles 673 can be formed by heat-treating the third metal layer.

Figure 19:
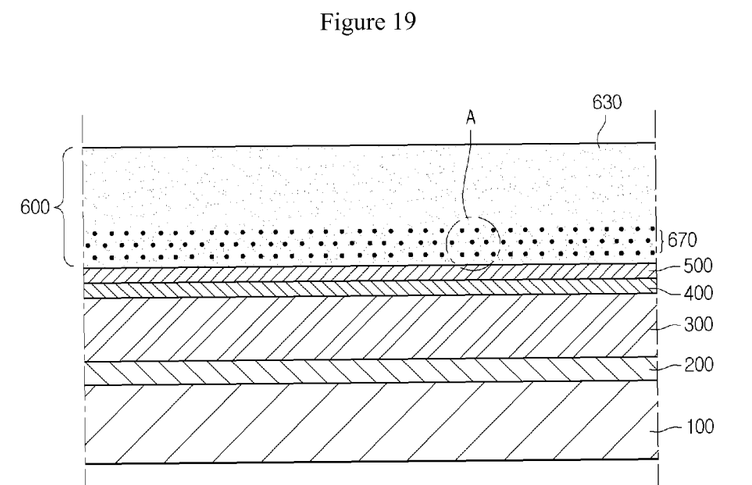

Referring to FIG. 19, a fourth transparent conductive layer 630 is formed on the third transparent conductive layer 604 to cover the third conductive particles 673. Accordingly, the window layer 600 is formed.

Diameters and distances of the first conductive particles 671 can be controlled according to thickness of the first metal layer 671a, heat-treating temperature and heat-treating time. Further, diameters and distances of the second conductive particles 672 can be controlled according to thickness of the second metal layer, heat-treating temperature and heat-treating time. Diameters and distances of the third conductive particles 673 can be controlled according to thickness of the third metal layer, heat-treating temperature and heat-treating time.

Further, distance between the first conductive particles 671 and the second conductive particles 672 can be controlled according to thickness of the second transparent conductive layer 603. Further, distance between the second conductive particles 672 and the third conductive particles 673 can be controlled according to thickness of the third transparent conductive layer 604.

Accordingly, the method for manufacturing the solar cell according to the embodiments may have improved light to electric energy conversion efficiency.

The solar cell according to the embodiments includes a window layer including a plurality of conductive particles. Particularly, the conductive particles can be included in the window layer by forming a nano-particle layer.

Therefore, resistance of the window layer is reduced by the nano-particle layer. Further, transmittance of the window layer can be improved by plasmon phenomenon caused by the conductive particles.

Particularly, because resistance of the window layer is reduced by the nano-particle layer, the thinner window layer can be formed. Namely, though it is formed thin, it can have enough conductivity because the window layer includes the conductive particles.

Accordingly, the window layer can be formed thinner, and as thickness becomes thinner, the amount of the required material and the process time can be reduced, and improved transmittance can be secured.

Thus, the solar cell according to the embodiments includes the window layer with improved electrical and optical properties, and has enhanced performance.

Further, a particular feature, structure, or effect described above in connection with the embodiment is included in at least one embodiment of the invention, but not limited to any one embodiment. Further, the particular feature, structure, or effect is described in each embodiment can be carried out in the combined or modified form with other embodiments by one having ordinary skilled in the art to which the embodiments pertain to. Therefore, contents related to the combination and modification should be interpreted to be included to the scope of the present invention.

While certain embodiments have been described, these embodiments have been presented by way of example only, and are not intended to limit the scope of the disclosures. Further, it will be apparent to those skilled in the art that modifications and variations not exemplified above can be made in the scope not departing from essential properties. For example, each component shown in detail in the embodiments may be modified and implemented. In addition, it should be understood that difference associated with the modification and application are included in the scope of the present invention defined in the appended claims.

INDUSTRIAL APPLICABILITY

The solar cell and the method for manufacturing the same according to the embodiments are applicable to photovoltaic powder generation fields.

The invention claimed is:

1. A solar cell comprising:
   a substrate;
   a rear electrode layer disposed on the substrate;
   a light absorption layer disposed on the rear electrode layer; and
   a window layer disposed on the light absorption layer,
   wherein the window layer comprises:
   a first transparent conductive layer on the light absorption layer;
   a nano-particle layer on the first transparent conductive layer; and
   a second transparent conductive layer on the nano-particle layer;
   wherein the nano-particle layer comprises:
   conductive particles; and
   a host surrounding the conductive particles;
   wherein a thickness of the nano-particle layer is in a range of 25 nm to 70 nm,
   wherein a thickness of the first transparent conductive layer is in a range of 20% to 80% of a thickness of the window layer, and
   wherein a thickness of the second transparent conductive layer is in a range of 20% to 80% of the thickness of the window layer.

2. The solar cell of claim 1, wherein the conductive particles are metal nano-particles.

3. The solar cell of claim 1, wherein the conductive particles comprise gold (Au) or silver (Ag).

4. The solar cell of claim 1, wherein diameters of the conductive particles are 5 nm to 20 nm.

5. A solar cell comprising:
   a substrate;
   a rear electrode layer disposed on the substrate;
   a light absorption layer disposed on the rear electrode layer;
   a buffer layer on the light absorption layer; and
   a window layer disposed on the buffer layer;
   wherein the window layer comprises:
   a nano-particle layer on the buffer layer; and
   a transparent conductive layer on the nano-particle layer;
   wherein the nano-particle layer comprises:
   conductive particles; and
   a host surrounding the conductive particles;
   wherein a thickness of the nano-particle layer is in a range of 25 nm to 70 nm; and
   wherein a thickness of the transparent conductive layer is in a range of 20% to 80% of a thickness of the window layer.

6. A solar cell comprising:
   a substrate;
   a rear electrode layer disposed on the substrate;
   a light absorption layer disposed on the rear electrode layer;
   a buffer layer on the light absorption layer; and
   a window layer disposed on the buffer layer;
   wherein the window layer comprises:
   a transparent conductive layer on the buffer layer; and
   a nano-particle layer on the transparent conductive layer;
   wherein the nano-particle layer comprises:
   conductive particles; and
   a host surrounding the conductive particles;

wherein a thickness of the nano-particle layer is in a range of 25 nm to 70 nm; and wherein a thickness of the transparent conductive layer is in a range of 20% to 80% of a thickness of the window layer.

* * * * *